(12) United States Patent
Wang et al.

(45) Date of Patent: Jan. 22, 2013
(10) Patent No.: US 8,358,543 B1

(54) FLASH MEMORY PROGRAMMING WITH DATA DEPENDENT CONTROL OF SOURCE LINES

(75) Inventors: Guowei Wang, Cupertino, CA (US); Sachit Chandra, Sunnyvale, CA (US); Nian Yang, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 1233 days.

(21) Appl. No.: 11/229,529

(22) Filed: Sep. 20, 2005

(51) Int. Cl.
*G11C 16/00* (2006.01)
*G11C 16/04* (2006.01)
*G11C 16/06* (2006.01)

(52) U.S. Cl. ......... 365/185.26; 365/185.02; 365/185.03; 365/185.11; 365/185.16; 365/238.5

(58) Field of Classification Search ............ 365/185.02, 365/185.03, 185.11, 185.12, 185.16, 185.26, 365/189.04, 220, 221, 238.5, 239
See application file for complete search history.

(56) References Cited

U.S. PATENT DOCUMENTS

| | | | |
|---|---|---|---|
| 5,291,446 A | 3/1994 | Van Buskirk et al. ... | 365/189.09 |
| 5,301,097 A | 4/1994 | McDaniel ............... | 363/60 |
| 5,430,674 A * | 7/1995 | Javanifard ............... | 365/185.1 |
| 5,539,688 A * | 7/1996 | Yiu et al. ................ | 365/185.18 |
| 5,638,326 A | 6/1997 | Hollmer et al. .......... | 365/185 |
| 5,748,534 A | 5/1998 | Dunlap et al. ........... | 365/185.21 |
| 5,751,637 A | 5/1998 | Chen et al. | |
| 5,757,711 A | 5/1998 | Nakaoka et al. .......... | 365/207 |
| 5,890,192 A * | 3/1999 | Lee et al. ............... | 711/103 |
| 5,892,710 A | 4/1999 | Fazio et al. ............. | 365/185.03 |
| 6,044,022 A | 3/2000 | Nachumovsky | |
| 6,101,125 A | 8/2000 | Gorman ................... | 365/185.19 |
| 6,163,483 A | 12/2000 | Pasotti et al. | |
| 6,259,635 B1 | 7/2001 | Khouri et al. | |
| 6,272,670 B1 | 8/2001 | Van Myers et al. ....... | 716/17 |
| 6,295,228 B1 | 9/2001 | Pawletko et al. ......... | 365/185.22 |
| 6,327,181 B1 | 12/2001 | Akaogi et al. ............ | 365/185 |
| 6,424,570 B1 | 7/2002 | Le et al. ................ | 365/185 |
| 6,426,893 B1 * | 7/2002 | Conley et al. ........... | 365/185.11 |
| 6,452,869 B1 | 9/2002 | Parker .................... | 365/238 |
| 6,487,121 B1 | 11/2002 | Thurgate et al. .......... | 365/185 |
| 6,496,410 B1 | 12/2002 | Parker .................... | 365/185.03 |
| 6,515,903 B1 | 2/2003 | Le et al. ................ | 365/185.18 |
| 6,519,180 B2 | 2/2003 | Tran et al. | |
| 6,535,419 B2 | 3/2003 | Parker et al. | |
| 6,538,923 B1 | 3/2003 | Parker .................... | 365/185 |
| 6,563,745 B1 | 5/2003 | Ilkbahar ................. | 365/189.07 |

(Continued)

FOREIGN PATENT DOCUMENTS

| | | |
|---|---|---|
| WO | WO 03/063167 A2 | 7/2003 |
| WO | WO 2005/106891 A1 | 11/2005 |

OTHER PUBLICATIONS

2002 IEEE International Solid-State Circuits Conference, Session 6, "SRAM and Non-Volatile Memories", Feb. 4, 2004, 6 pages.

(Continued)

*Primary Examiner* — J. H. Hur
(74) *Attorney, Agent, or Firm* — Harrity & Harrity, LLP (57) ABSTRACT

Techniques for programming a non-volatile memory device, such as a Flash memory, include floating source lines of memory cells based on a data pattern that is being programmed to the memory device. The source lines to float are selected such that a distance between drain bit lines and source bit lines of different memory cells in a row is maximized. In this manner, leakage current between these drain bit lines and source bit lines can be decreased.

20 Claims, 9 Drawing Sheets

U.S. PATENT DOCUMENTS

| | | | |
|---|---|---|---|
| 6,570,785 B1 * | 5/2003 | Mangan et al. | 365/185.02 |
| 6,597,619 B2 | 7/2003 | Stubbs et al. | |
| 6,665,215 B2 | 12/2003 | Thomas et al. | 365/185.25 |
| 6,687,159 B2 | 2/2004 | Pasotti et al. | |
| 6,724,662 B2 | 4/2004 | Manea | 365/185.22 |
| 6,735,117 B2 | 5/2004 | Ott | 365/185.18 |
| 6,747,900 B1 | 6/2004 | Park et al. | 365/185 |
| 6,775,187 B1 | 8/2004 | Hamilton et al. | |
| 6,816,001 B2 | 11/2004 | Khouri et al. | 327/536 |
| 6,842,388 B2 | 1/2005 | Origasa et al. | |
| 6,906,966 B2 | 6/2005 | Shor et al. | 365/185.23 |
| 6,914,835 B2 | 7/2005 | Nakamura et al. | |
| 6,947,347 B2 | 9/2005 | Fujioka | 365/185.33 |
| 6,952,366 B2 | 10/2005 | Forbes | 365/185.08 |
| 6,996,021 B2 | 2/2006 | Derner et al. | 365/210 |
| 7,020,018 B2 | 3/2006 | Hsieh et al. | 365/185.03 |
| 7,057,939 B2 | 6/2006 | Li et al. | 365/185.28 |
| 7,149,110 B2 | 12/2006 | Tran et al. | 365/185.03 |
| 7,151,701 B2 | 12/2006 | Combe et al. | 365/185.2 |
| 7,154,794 B2 | 12/2006 | Ahne et al. | 365/185.18 |
| 7,177,184 B2 | 2/2007 | Chen | |
| 7,190,616 B2 | 3/2007 | Forbes et al. | 365/185.05 |
| 2001/0040836 A1 | 11/2001 | Mori et al. | 365/240 |
| 2002/0167844 A1 * | 11/2002 | Han et al. | 365/185.28 |
| 2003/0046481 A1 | 3/2003 | Kushnarenko | 711/103 |
| 2003/0093233 A1 | 5/2003 | Rajguru | 702/64 |
| 2003/0142544 A1 * | 7/2003 | Maayan et al. | 365/185.16 |
| 2003/0172309 A1 | 9/2003 | Cioaca | |
| 2004/0027857 A1 * | 2/2004 | Ooishi | 365/185.11 |
| 2004/0037113 A1 * | 2/2004 | Ooishi | 365/185.11 |
| 2004/0109354 A1 | 6/2004 | Wang et al. | 365/185.11 |
| 2007/0035991 A1 | 2/2007 | Chen et al. | 365/185.01 |

OTHER PUBLICATIONS

2002 IEEE International Solid-State Circuits Conference, 29 pages.
Co-pending U.S. Appl. No. 11/212,614, filed Aug. 29, 2005, entitled: "Voltage Regulator with Less Overshoot and Faster Settling Time," Yonggang Wu et al.; 30 pp.
Co-pending U.S. Appl. No. 11/229,664, filed Sep. 20, 2005, entitled: "Flash Memory Programming Using an Indication Bit to Interpret State," Takao Akaogi et al.; 25 pp.
International Search Report and Written Opinion dated Jan. 15, 2007.

* cited by examiner

Fig. 7 and various power supply and control signals used to operate memory device 100.

FLASH MEMORY PROGRAMMING WITH DATA DEPENDENT CONTROL OF SOURCE LINES

TECHNICAL FIELD

The present invention relates generally to non-volatile memory devices, and more specifically, to data programming operations for non-volatile memory devices.

BACKGROUND ART

Flash memory is a common type of non-volatile semiconductor memory device. Non-volatile refers to the trait of retaining stored data when power is turned off. Because Flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often comprise a high density section and a low density section. For example, a Flash memory may include one or more high density core regions and a low density peripheral portion formed on a single substrate. The high density core regions typically include arrays of individually addressable, substantially identical floating-gate type memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In one particular type of Flash memory architecture, called NOR Flash memory, memory cells within the core portion are coupled together in a circuit configuration in which each memory cell has a drain, a source, and a stacked gate. In operation, memory cells in the core portion may be addressed by circuitry in the peripheral portion to perform functions such as reading, erasing, and programming of the memory cells.

When programming NOR-type Flash memory cells, multiple memory cells may be programmed at once. In a programming operation, each cell being programmed is a load to the power generation circuitry in the memory device. In such a programming architecture, it is desirable to efficiently use power during programming.

DISCLOSURE OF THE INVENTION

One aspect is directed to a memory device configured for simultaneous programming of a number of memory cells in a multi-bit programming operation. The memory device includes at least one array of non-volatile memory cells, each of the memory cells being connected to a source bit line and a drain bit line. The memory device further includes control logic configured to program the memory cells. The programming includes floating select ones of the source bit lines that were grounded in a previous programming operation, where the select ones of the source bit lines are selected based on a data pattern present in the multi-bit programming operation.

Another aspect is directed to a method of programming a non-volatile memory array. The method includes obtaining data bits corresponding to a program window that is to be written to the memory array and dividing the obtained data bits into sub-windows. The method further includes simultaneously programming memory cells corresponding to one or more of the sub-windows. The programming includes floating source bit lines of memory cells that are not to be programmed based on a pattern of the data bits in the sub-window so that a distance between source and drain voltages of different memory cells is maximized.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Techniques described below relate to a Flash memory programming technique in which voltages applied to memory cells that are not being programmed depend on a programming pattern of the memory cells. The voltages are applied so as to minimize leakage current in the device.

Memory Device Overview

Figure 1:
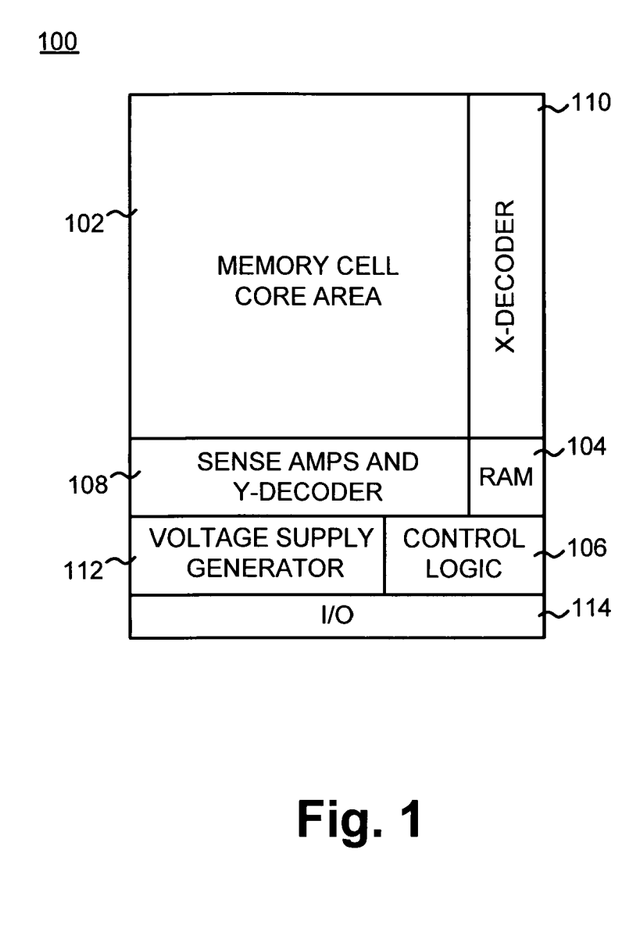
FIG. 1 is a block diagram illustrating an exemplary high-level implementation of a memory device.

FIG. 1 is a block diagram illustrating an exemplary high-level implementation of a memory device 100. Memory device 100 may be a Flash memory device implemented as an integrated circuit.

As shown in FIG. 1, memory device 100 includes a core area 102. Core area 102 may include arrays of high density memory cells, such as, for example, SONOS-type (silicon-oxide-nitride-oxide-silicon) NOR memory cells, where the nitride layer acts as the charge storage element. More specifically, core area 102 may include multiple M×N memory arrays of substantially identical memory cells.

The memory cells in area 102 may be implemented such that each memory cell can store two or more bits. In one such multi-bit per memory cell technology, called MirrorBit™, the intrinsic density of a Flash memory array can be doubled by storing two physically distinct charges on opposite sides of a memory cell. Each charge, representing a bit within a cell, serves as a binary unit of data (e.g. either "1" or "0"). Reading or programming one side of a memory cell occurs independently of the data that is stored on the opposite side of the cell.

Although shown as a single block in FIG. 1, core area 102 may be implemented as a number of memory cell arrays. Each such memory cell array may be associated with X-decoder 110 and Y-decoder 108. X-decoder 110 and Y-decoder 108 may decode address information, such as addresses received by memory device 100 that define a specific byte or word (or groups of bytes or words) that are to be written to or read from. The decoded addresses specify the appropriate physical lines in the memory cell array(s) that are to be used.

Y-decoder 108 may also include appropriate sense amplifier circuitry. Sense \amplifiers may be used to sense the programmed or non-programmed state of the memory cells in core area 102.

Random access memory (RAM) 104 may include memory, such as static dynamic random access memory (SRAM) or dynamic random access memory (DRAM) type memory, that can serve as a memory cache between core area 102 and I/O lines 114. Relative to the memory cells in core area 102, RAM 104 may be a higher speed memory and may be a volatile memory (i.e., loses its data when powered down). I/O lines 114 may provide buffering to facilitate data transfer between RAM 104 and memory device 100 and/or between core area 102 and RAM 104.

Voltage supply generator 112 may act as a power supply for the program, read, and erase functions performed on the memory cells in core area 102. Programming and erasing the memory cells, in particular, may require supply voltages larger than those supplied to memory device 100. For example, memory device 100 may be powered from a 3.5 volt source while a program operation may require a nine volt source. Voltage supply generator 112 may use one or more charge pumps to generate these higher voltages.

Control logic 106 may generally control X-decoder 110, Y-decoder 108, RAM 104, voltage supply generator 112, and I/O lines 114 to control the read, program, and erase of memory cell core area 102. Control logic 106 may include a state machine that appropriately manipulates memory cell core area 102 based on input address, data, and control signals received by memory device 100 through I/O lines 114.

Figure 2:
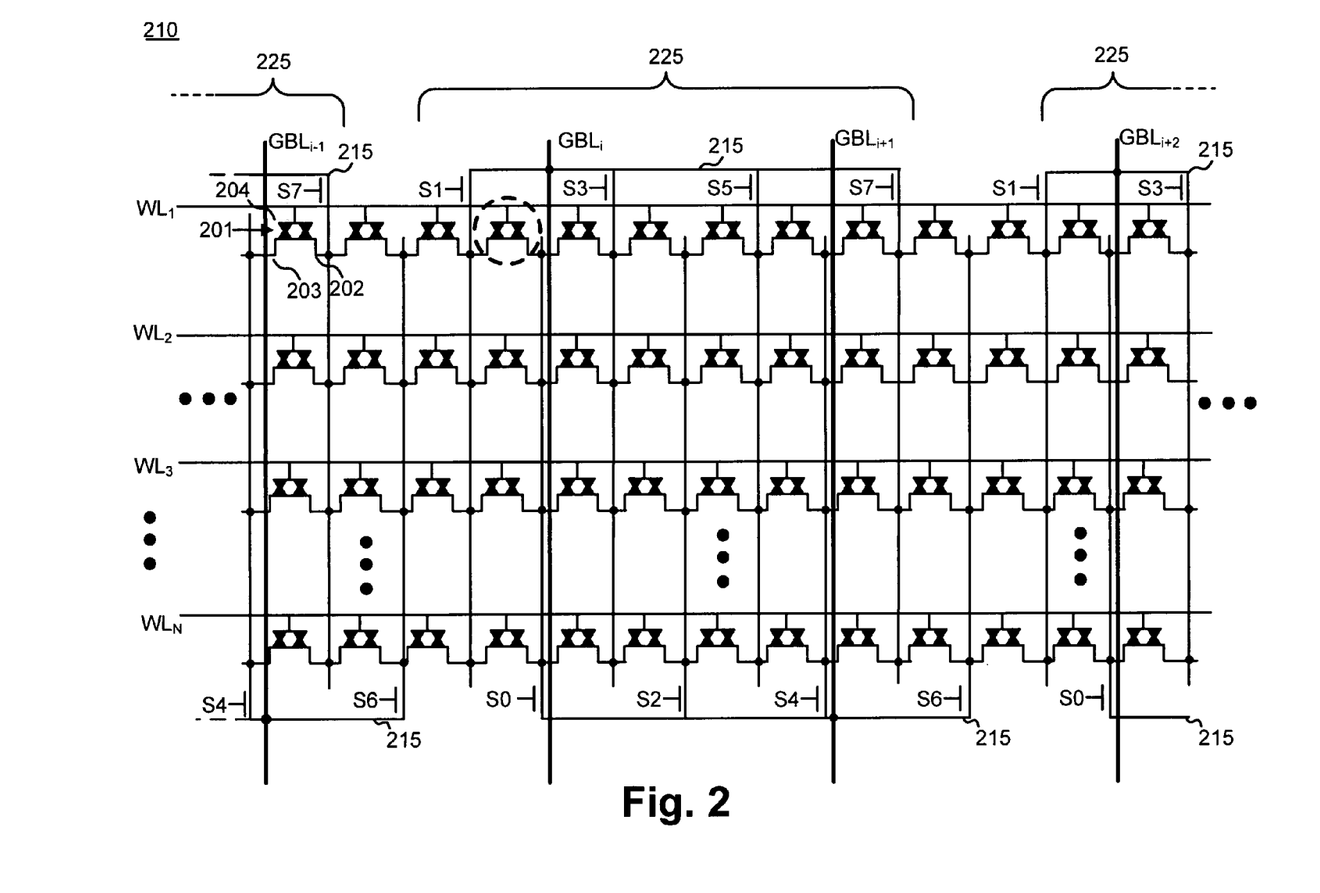
FIG. 2 is a diagram illustrating an exemplary portion of an array of memory cells implemented in the core area shown in FIG. 1.

FIG. 2 is a diagram illustrating an exemplary portion of an array of memory cells implemented in core area 102, labeled as memory array 210. The array includes a number of substantially identical memory cells 201. Each memory cell 201 includes a drain 202, a source 203, and a stacked gate region 204. Drain 202 and source 203 are interchangeable within a memory cell depending on the applied voltages and may be switched with respect to one another. The NOR configuration illustrated in FIG. 2 includes word lines (word lines $WL_1$ through $WL_N$) each connected to the gate region 204 of a number of memory cells in a row. Bit lines are arranged orthogonally to the word lines in array 210. The bit lines include global bit lines ($GBL_{i-1}$ through $GBL_{i+2}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. As an example of selecting a particular memory cell 201 within a group 225 (e.g., the memory cell within the dotted circle in FIG. 2), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although the memory cells 201 in core area 102 are shown as NOR memory cells, in some implementations, the circuitry in the peripheral regions of memory device 100 may provide an external interface that mimics an external interface normally provided by NAND-type Flash memories. In this situation, memory device 100, from the point of view of the user/circuit designer, can effectively be thought of as a NAND-type Flash device even though core area 102 includes NOR-type Flash memory.

Although only four global bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines correspond to 256 eight memory cell groups 225 of select transistors.

Figure 3:
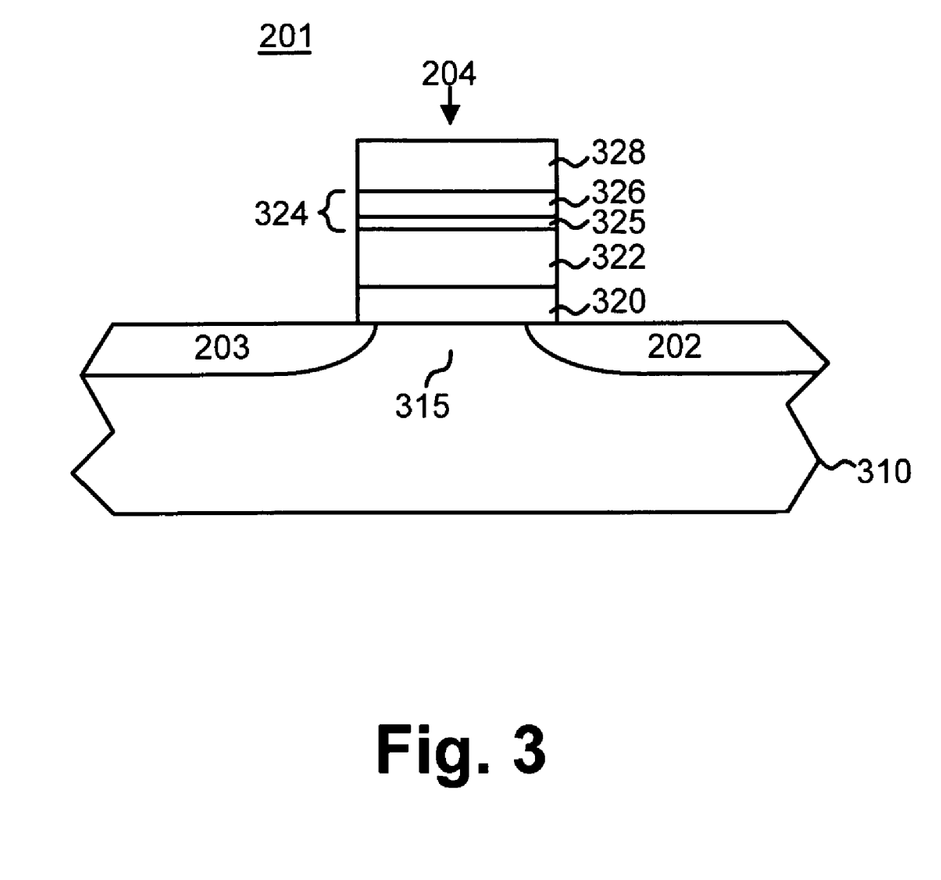
FIGS. 3 and 4 are diagrams illustrating a cross-section of an exemplary one of the memory cells shown in FIG. 2.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconducting material such as silicon, germanium, or silicon-germanium. Drain and source regions 202 and 203 may be regions that are doped with n-type impurities, such as phosphorous or arsenic, or p-type impurities, such as boron. As previously mentioned, depending on the applied voltage values, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for the memory cell.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of the charge storage layer 322. In this manner, the charges in charge storage layer 322 become effectively trapped on each respective side of charge storage layer 322 and the density of the resulting memory array may be increased as compared to memory devices that store only one bit of data per cell. In alternate implementations, charge storage layer 322 may store charges representing three or more bits of data for each memory cell 201.

Second dielectric layer 324 may be formed on layer 322 and may include a multi-layer structure, such as a first silicon oxide layer 325 and a second high dielectric constant (high-K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or alumina.

Control gate 328 may be formed above second dielectric layer 324. Control gate 328 may be formed of, for example, polysilicon and may be connected to the word line of memory cell 201.

In operation, core area 102 of memory device 100 may be programmed by a channel hot electron injection process that injects electrons into charge storage layer 322. The injected electrons become trapped in charge storage layer 322 until an erase operation is performed.

In operation, memory cells 201 in core array 102 may be programmed by applying a relatively high voltage (e.g., 9 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 225. For example, approximately five volts may be applied to $GBL_i$ and $GBL_{i+1}$ may be grounded. Also, select transistors S0 and S1 may be turned on by applying an appropriate voltage to S0 and S1. These voltages generate a vertical and lateral electric field in the activated memory cell(s) (e.g., the circled memory cell in FIG. 2) along the length of the channel from the source to the drain. These electric fields causes electrons to be drawn off the source and begin accelerating toward the drain. As they move along the length of the channel, they gain energy. If they gain enough energy, they can jump over the potential barrier of the dielectric layer 320 into one side of charge storage layer 322 and become trapped. The trapped electrons change the electrical properties of the memory cell. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

Figure 4:
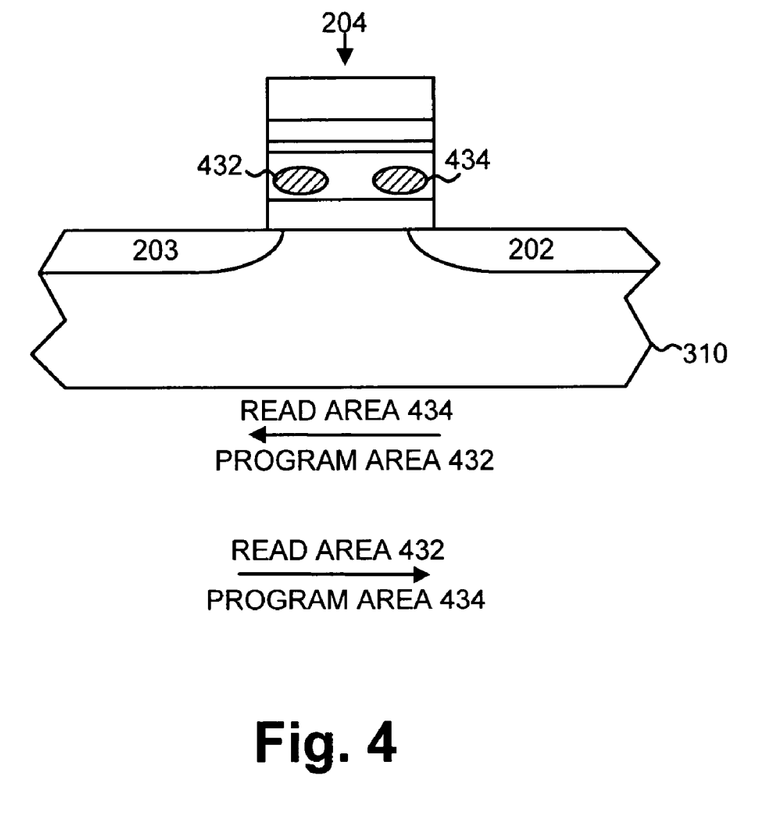

When two bits are stored in charge storage layer 322, the second bit is programmed in a manner similar to the first bit, except that the source and drain terminals are reversed in both directions. FIG. 4 is a diagram illustrating a cross-section of the exemplary memory cell shown in FIG. 3. Additionally, FIG. 4 illustrates read and program directions associated with current flow for when memory cell 201 is used to store charges representing two independent bits. Memory cell 201 includes two separate charge storage areas 432 and 434 within charge storage layer 322. Each storage area 432 and 434 may define one bit. To program the left area 432 or read the right area 434, area 203 acts as the drain and receives a high voltage relative to area 202, which acts as the source. To program the right area 434 or read the left area 432, area 202 acts as the drain and receives a high voltage relative to area 203, which acts as the source. The arrows in FIG. 4 graphically illustrate the direction of charge flow.

Memory Device Programming

As previously mentioned, multiple memory cells 201 in a row (i.e., the memory cells 201 having a common word line) can be simultaneously programmed by activating a word line and pairs of select transistors S0 through S7 in different groups 225. Simultaneously programming multiple memory cells 201 can be conceptually thought of as programming multiple memory cells within a "program window." In the exemplary implementation described herein, the program window size will be described as being 256 bits wide. That is, programming is performed in 256-bit chunks. One of ordinary skill in the art will recognize that other program window sizes could be used.

Figure 5:
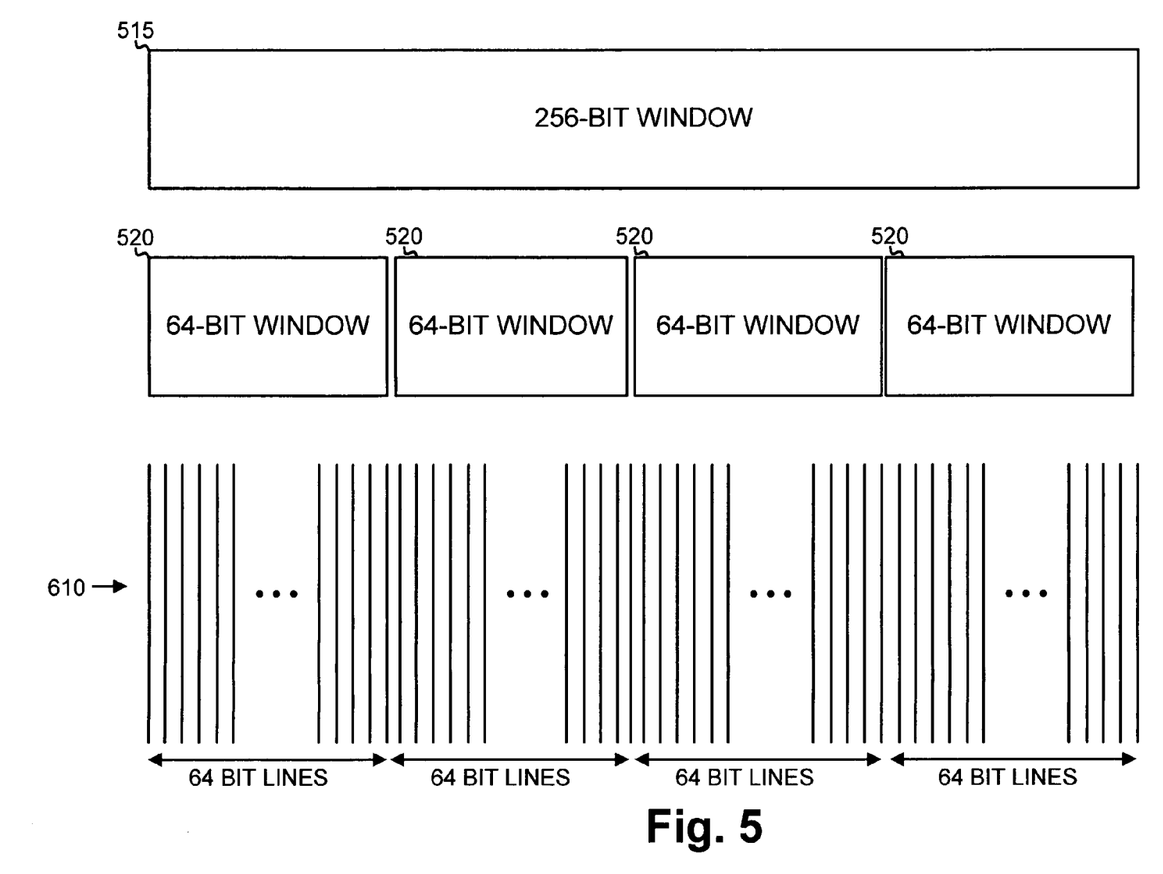
FIG. 5 is a diagram illustrating an exemplary programming window that is applied to the memory device shown in FIG. 1.

A programming window 515 is illustrated in FIG. 5. Programming window 515 may include the 256 bits that are to be written to core area 102. Based on each of the bits in programming window 515, memory device 100 may determine whether a physical memory cell 201 that corresponds to a bit in programming window 515 needs to be programmed. Programming window 515 may be further subdivided into sub-windows 520, such as by subdividing the 256 bits in programming window 520 into four 64-bit windows. The four 64-bit windows 520 may then be simultaneously or sequentially programmed to core area 102. Each bit line that is to be programmed may draw a fixed programming current from voltage supply generator 112.

Memory programming will be further described herein as being based on a 64-bit sub-window 520. One or ordinary skill in the art will recognize that other programming sub-window sizes could be used. Also, the concept of having a programming window including sub-windows may alternatively be implemented as a single programming window without sub-windows.

Although sub-window 520 includes 64 bits, a program technique referred to herein as an inverse programming method may be used, which ensures that at most, only half of these bits (i.e., 32) will actually need to be programmed to their respective memory cells. Additionally, memory configuration bits that are not related to the substantive data programmed to memory cells 201 may also need to be programmed with these 32 (maximum) number of bits. These configuration bits may include bits such as a spare bit, an indication bit, and a dynamic reference bit. In one implementation, a maximum of five configuration bits may need to be programmed for each sub-window 520, giving 37 total maximum bits for programming for each 64-bit sub-window 520.

The inverse programming method dynamically selects how to interpret a programmed cell 201 based on the data in sub-window 520. For example, if a non-programmed memory cell 201 (i.e., a cell with no stored charge) is normally interpreted as being a logical one, and sub-window 520 includes all logical zeros, instead of programming all the bits in sub-window 520 (i.e., 64 bits), the non-programmed memory cells 201 in sub-window 520 may instead be interpreted as corresponding to a logic zero. In this manner, instead of programming all 64 bits of sub-window 520, none of the bits in sub-window 520 need to be programmed. In this example, as few as one configuration bit may be programmed, such as the dynamic reference bit, to indicate that the memory cells in the sub-window are to be interpreted with non-programmed memory cells being a logic zero.

In one implementation, multiple sub-windows 520 may be simultaneously programmed. The number of sub-windows 520 that are simultaneously programmed in a particular programming operation may be based on the total number of bits that need to be programmed within the sub-windows 520. For example, assume that voltage supply generator 112 can supply enough voltage to simultaneously program a maximum of approximately 40 bits at any one time. In this situation, if the total number of memory cells 201 in 256-bit window 515 that are to be programmed is less than this number (e.g., 40), all four sub-windows 520 may be simultaneously programmed. If the total number of memory cells 201 in 256-bit window 515 that are to be programmed is greater than the maximum, however, a subset of the four sub-windows 520 may be simultaneously programmed. For example, if the total number of memory cells 201 in 256-bit window 515 that are to be programmed is 100, with 25 memory cells in each sub-window 520, sub-windows 520 may be programmed one after the other until all four sub-windows 520 are programmed.

Figure 6A:
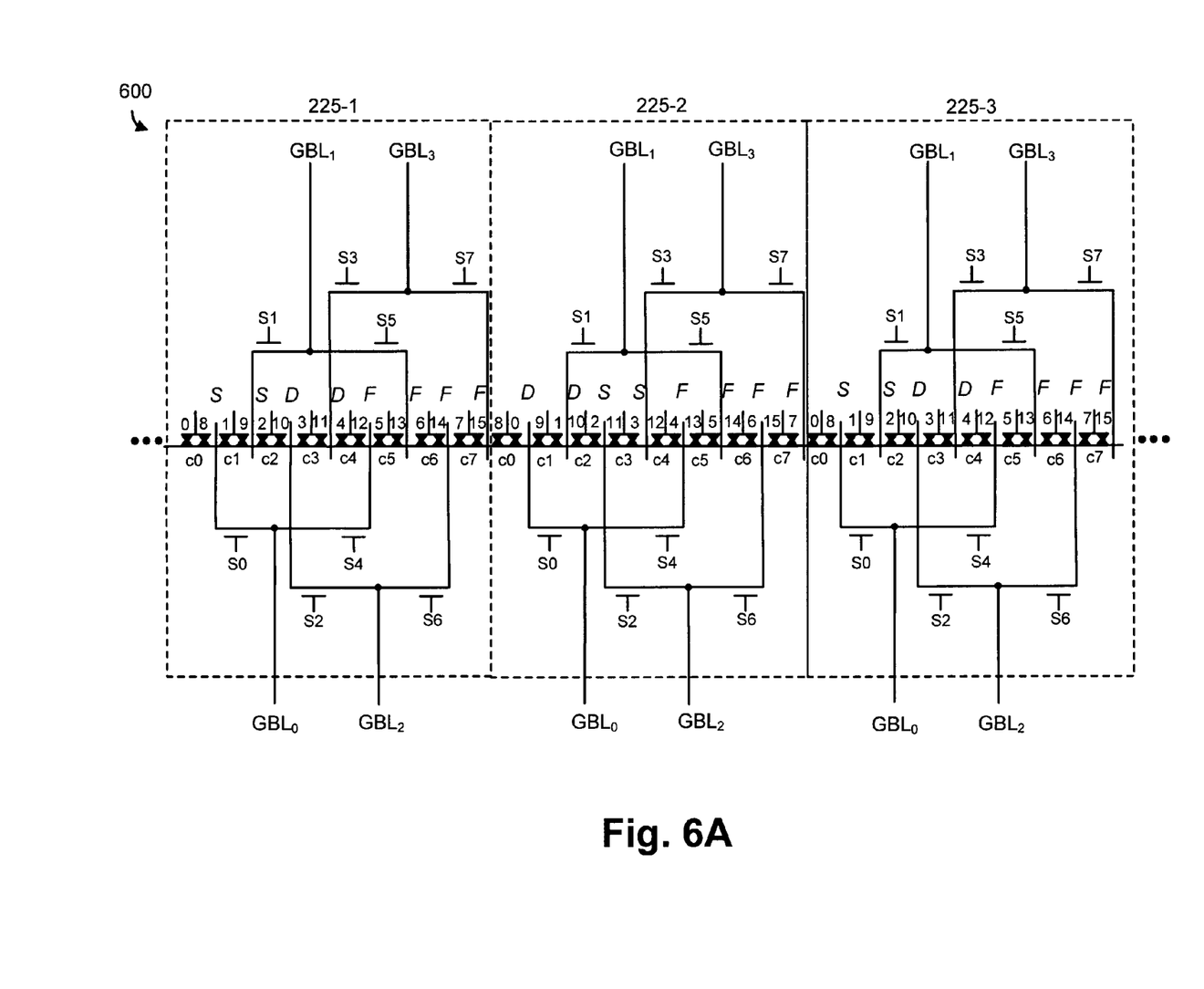
FIGS. 6A-6C are diagrams illustrating a portion of a single row of memory cells in FIG. 2 in additional detail.

FIG. 6A is a diagram illustrating a portion of a single row 600 of memory cells in FIG. 2 in additional detail, such as the row connected to the first wordline ($WL_1$). In this example, program groups 225 are illustrated in more detail as program group 225-1, 225-2, and 225-3. Each program group 225 includes eight memory cells, labeled as memory cells c0 through c7. As previously mentioned, each memory cell c0 through c7 may be capable of storing two bits of information, such as by independently storing charge on a left side and a right side of the memory cell. These individually addressable programming bits are labeled in FIG. 6A as program bits zero through 15, in which two program bits are shown corresponding to each memory cell. Although each group 225 in FIG. 2 is illustrated as including two global bit lines, in the more detailed illustration of FIG. 6A, four global bit lines $GBL_0$ through $GBL_3$ are illustrated for each memory cell group 225-1 through 225-3. In the context of FIG. 2, $GBL_0$ and $GBL_2$ may be considered to correspond to $GBL_i$; and $GBL_1$ and $GBL_3$ may be considered to correspond to $GBL_{i+1}$.

As an example of voltages applied to the bit lines in FIG. 6A, consider the situation in which programming bit 10 in memory cells c2 in each of groups 225-1 through 225-3 are to be programmed. In this situation, global bit lines $GBL_0$ through $GBL_3$ and select transistors S0 through S7 may be controlled to apply source voltages S (e.g., ground) and drain voltages D (e.g., approximately five volts) to various bit lines in groups 225-1 through 225-3. In particular, as shown in FIG. 6A, for groups 225-1 and 225-3, source voltages may be applied through select transistors S0 and S1 while drain voltages are applied through select transistors S2 and S3. For group 225-2, drain voltages may be applied through select transistors S0 and S1 while source voltages are applied through select transistors S2 and S3. Select transistors S4-S7 may be controlled to be in their non-conductive state, which tends to float (F) the corresponding bit lines. A floating bit line is one that is disconnected from a voltage source.

With the voltages applied as shown in FIG. 6A, program bit 10 for memory cells c2 in each of groups 225-1 through 225-3 will be programmed. For each memory cell that is programmed, the double pattern of source voltages and drain voltages (SSDD for groups 225-1 and 225-3 or DDSS for group 225-2) can be used to improve the programming operation relative to activating the source and drain bit lines of only the memory cell being programmed. Because of facing drain or source voltages, there is relatively little leakage current flowing from drain lines (DD) in group 225-1 to drain lines (DD) in group 225-2, or similarly, between source lines (SS) between groups 225-2 and 225-3.

Figure 6B:
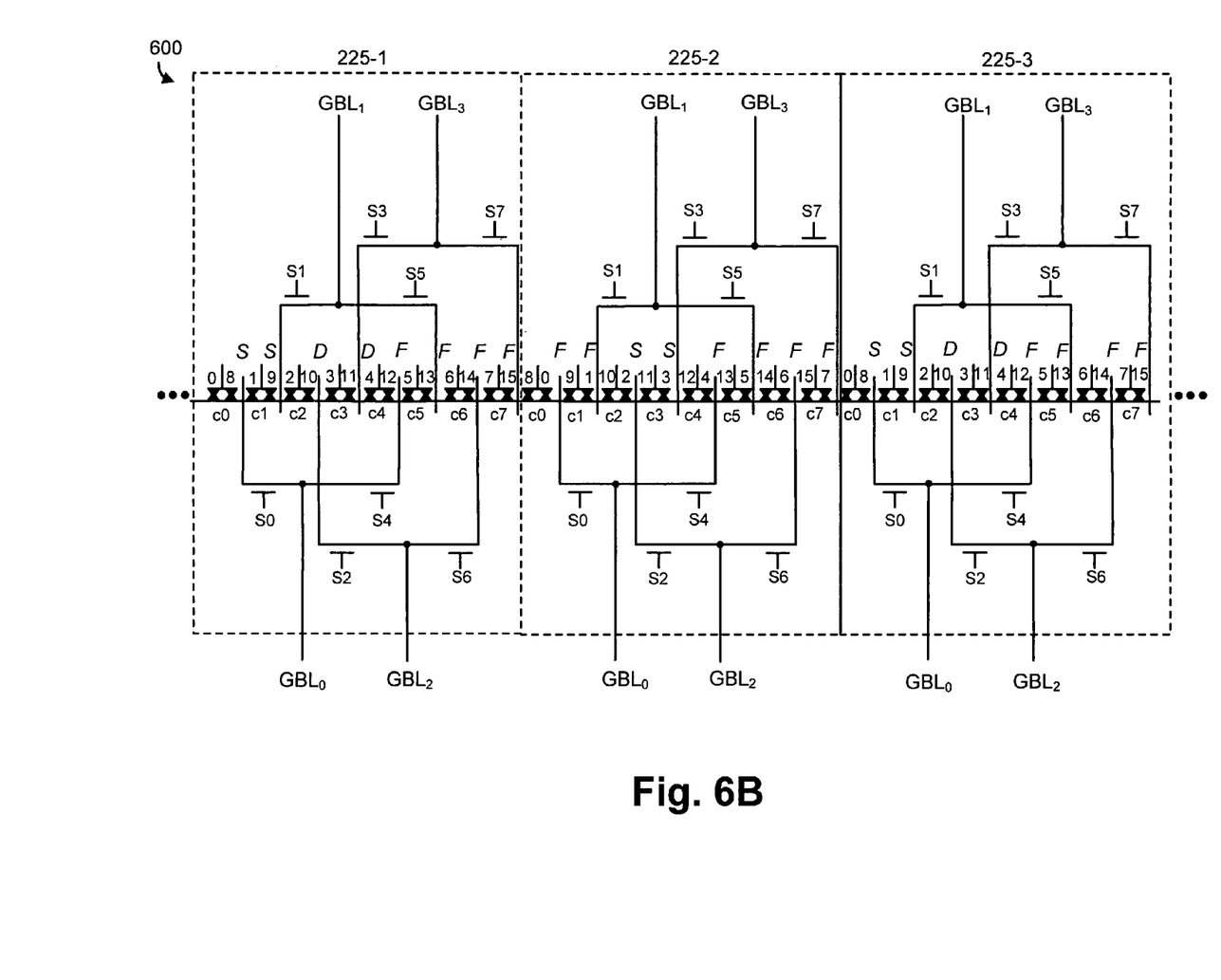

As a second example of programming memory cells in groups 225-1 through 225-3, consider the situation in which program bit 10 of memory cell c2 in groups 225-1 and 225-3 is to be programmed, but not memory cell c2 in group 225-2. Conventionally, voltages may be applied through select switches in groups 225-1 through 225-3 in a manner similar to when program bit 10 of cell c2 in each of groups 225-1 through 225-3 are to be programmed, except that the drain voltages (DD) are not applied in group 225-2. This situation is illustrated in FIG. 6B, which is a diagram of row 600 in which program bit 10 of memory cell c2 in groups 225-1 and 225-3 are programmed and no programming is performed on the memory cells in group 225-2. As shown, in FIG. 6B, select switches S0 and S1 are turned off (i.e., controlled to be in a non-conductive state), thus floating their corresponding bit lines in group 225-2 (represented as FF in FIG. 6B). Conventionally, the two bit lines to the right of memory cell c2 in group 225-2 (i.e., the bit lines controlled by select switches S2 and S3) may remain grounded.

The grounded source (SS) bit lines in group 225-2 create a voltage potential with the drain bit lines (DD) in group 225-1. In the example shown in FIG. 6B, the drain lines of memory cells c2 and c3 (DD) in group 225-1 and the source lines of memory cells c2 and c3 (SS) in group 225-2 are separated by six bit lines (e.g., by the six floating lines (F)). This relatively close physical separation between these memory cells can allow large leakage current to flow from drain lines (DD) in group 225-1 to source lines (SS) in group 225-2. This leakage current can degrade the performance of memory device 100 by, for example, wasting power and decreasing the number of bits that can potentially be programmed in a programming cycle.

Figure 6C:
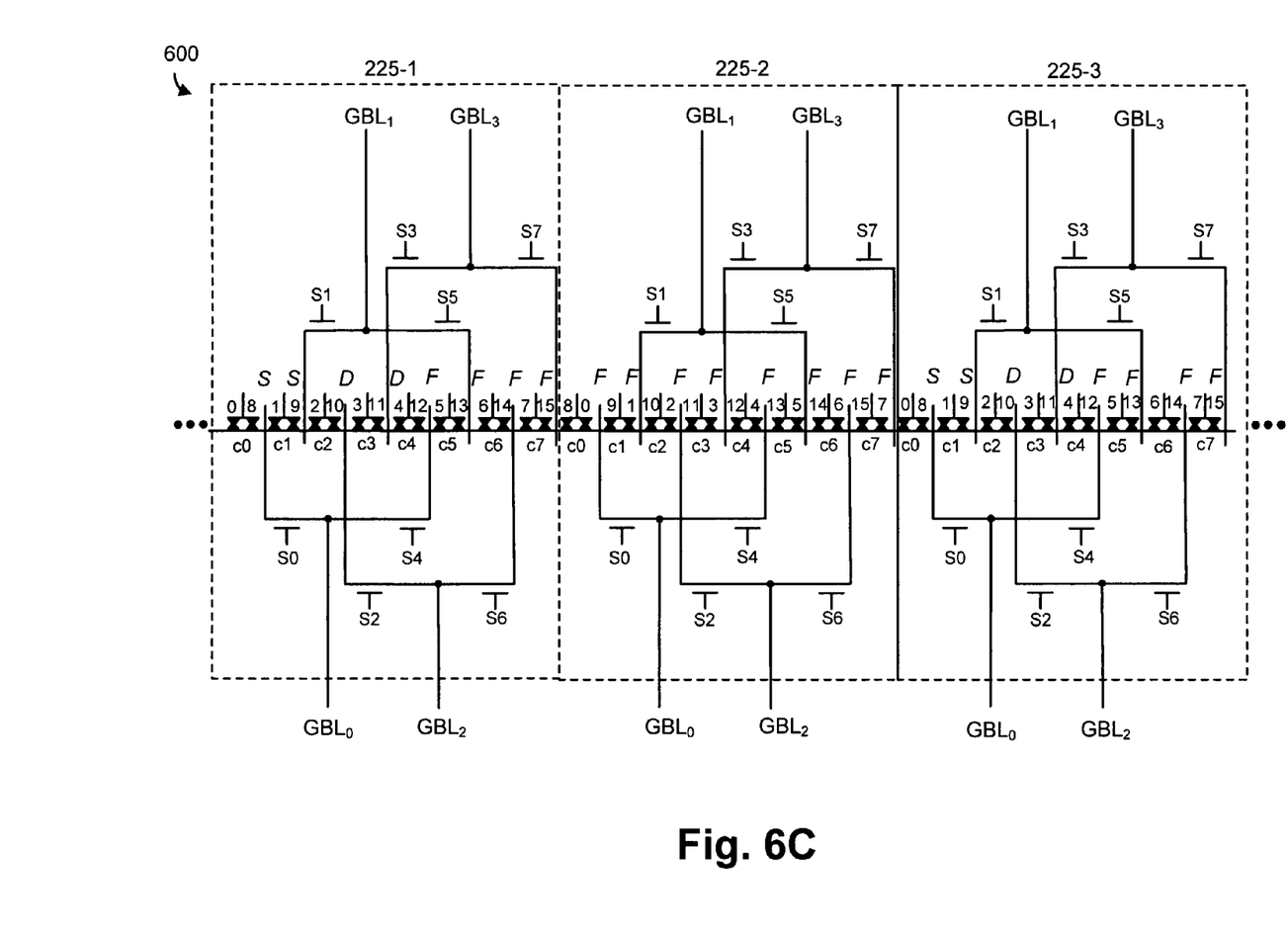

FIG. 6C is a diagram of a row 600 in which a programming operation consistent with aspects of the invention is illustrated. As with the programming example shown in FIG. 6B, assume that program bit 10 of memory cells c2 in groups 225-1 and 225-3 are to be programmed, but program bit 10 of memory cell c2 in group 225-2 is not to be programmed. In this implementation, the source lines of memory cells c2 and c3 (SS) in group 225-2 are floated by, for example, turning off select transistors S2 and S3 in group 225-2. By floating these source lines instead of grounding them, the physical separation between the drain lines (DD) in group 225-1 and the next pair of ground source lines (i.e., the grounded source lines (SS) in group 225-3) increases from six memory cells in the situation of FIGS. 6B to 12 memory cells in the situation shown in FIG. 6C. Accordingly, leakage current between this pair of source and drain lines decreases significantly.

Figure 7:
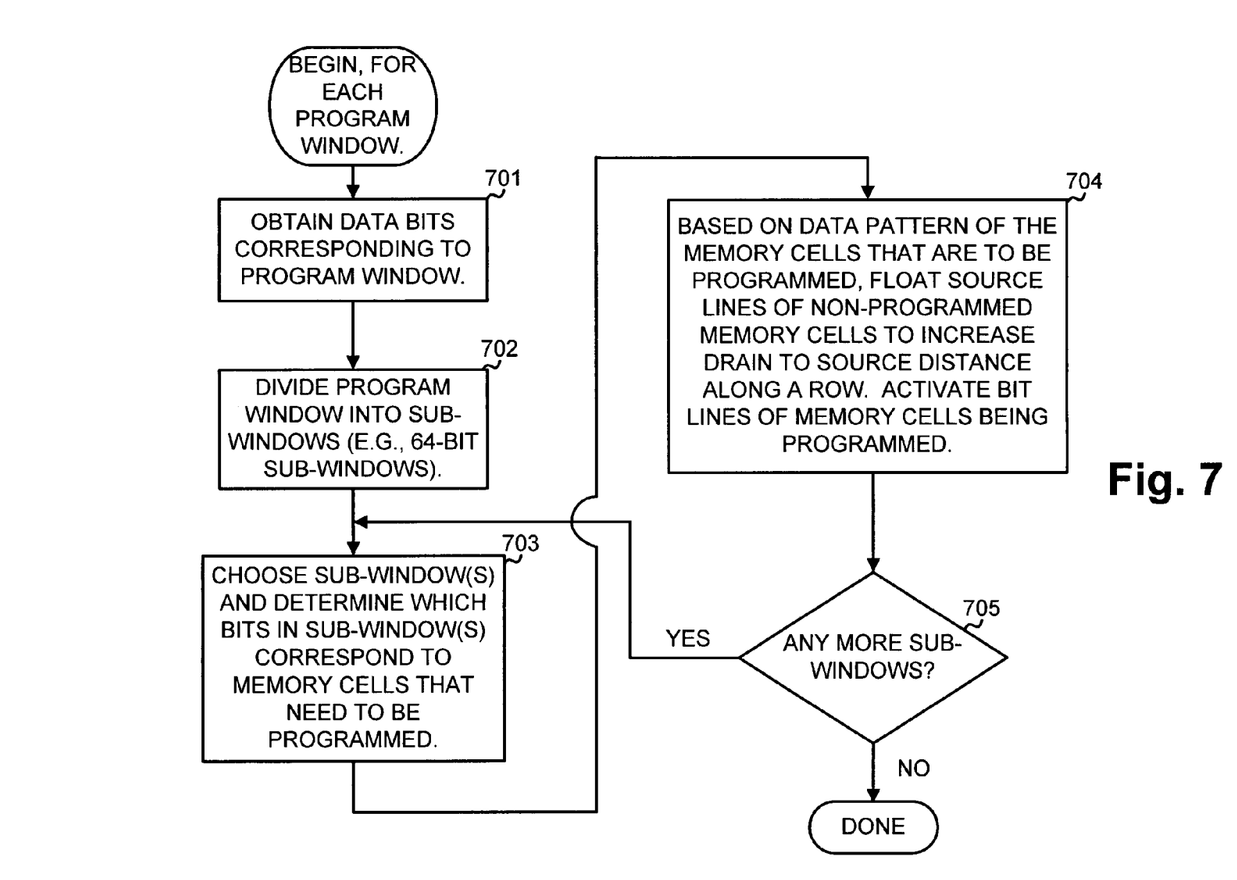
FIG. 7 is a flow chart illustrating exemplary operations for programming a memory device.

FIG. 7 is a flow chart illustrating operations consistent with aspects of the invention for programming memory cells. A program window, such as program window 515, is obtained that includes the bits that are to be written to memory (act 701). As mentioned, one possible size for the program window may be a 256-bit program window. The program window may be divided into sub-windows 520, such as four 64-bit sub-windows (act 702).

For select sub-windows 520 that are to be written, logic in memory device 100, such as, for example, logic in Y-decoder circuitry 108 or control logic 106, may determine which bits in the selected sub-window require programming (act 703). The inverse programming method, as described previously, may be used to minimize the required number of memory cells 201 that need to be programmed. Data corresponding to the sub-windows 520 may then be sequentially written to the memory cells. Depending on the data pattern within program window 515, multiple sub-windows 520 may be simultaneously written (act 703).

In addition, based on the data pattern that is being programmed, source bit lines that were grounded in the previous programming operation may be floated to increase or maximize the drain to source distance along a row (act 704). An example of this concept was described above with reference to FIG. 6C, in which source lines adjacent to programming bit 10 of memory cell c2 are floated to increase the distance (measured in number of bit lines) between drain bit lines (DD) and source bit lines (SS) in different program groups. In some implementations, all unused source lines may be floated. In other implementations, only select ones of the unused source lines that were grounded in the previous programming operation may be floated, where the selection of the source lines for floating is based on the data pattern being programmed and the general goal to maximize or increase the number of bit lines between source and drain voltages that do not correspond to a single memory cell. Additionally, the bit lines of the memory cells that are being programmed may be appropriately activated (act 704). The word line of the row being programmed is also activated.

Acts 703 and 704 may be repeated for the other sub-windows in programming window 515 (act 705).

CONCLUSION

Data dependent programming techniques were described above in which source lines of memory cells are controlled to maximize bit line distance between drain and source voltages. Advantageously, leakage current can be reduced.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 7, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A memory device comprising:
   at least one array of non-volatile memory cells, where each of the memory cells is connected to a source bit line and a drain bit line;
   control logic to determine a number of bits, where each bit, of the number of bits, corresponds to one of the memory cells;
   control logic to program half the number of determined bits to the corresponding memory cells based on an inverse programming operation, the inverse programming operation including floating select ones of the source bit lines that were grounded in a previous inverse programming operation, where the select ones of the source bit lines are selected based on a data pattern present in a multi-bit programming operation; and
   control logic to program a plurality of configuration bits that are not related to the programmed bits, where the plurality of configuration bits include a spare bit, an indication bit, and a dynamic reference bit.

2. The memory device of claim 1, where the source bit lines that are floated are selected to maximize a distance between drain and source bit lines of different memory cells in a row of the array.

3. The memory device of claim 1, where each memory cell is capable of storing two bits of data and functionality of the drain bit line and the source bit line of a memory cell are reversed when programming alternate ones of the two bits of data.

4. The memory device of claim 1, further comprising:
   a plurality of select switches to control each of the source bit lines and drain bit lines of the memory cells, the select switches being controlled to be in a non-conductive state and float the select ones of the source bit lines.

5. The memory device of claim 1, where the memory cells, of the array of non-volatile memory cells, are arranged in groups, each group corresponding to a predetermined number of memory cells.

6. The memory device of claim 1, where floating the select ones of the source bit lines reduces leakage current in the memory device.

7. The memory device of claim 1, where the array of non-volatile memory cells is arranged as a plurality of rows of the non-volatile memory cells, each of the memory cells in a row being connected to a word line.

8. The memory device of claim 1, where each of the non-volatile memory cells includes:
   a dielectric charge storage element to store two independent charges.

9. The memory device of claim 1, where the number of programmed configuration bits is less than or equal to five.

10. The memory device of claim 1, where each of the memory cells includes a stacked gate.

11. The memory device of claim 1, where each of the memory cells is formed on a substrate, and the substrate is formed of a semiconducting material.

12. The memory device of claim 11, where the semiconducting material includes silicon, germanium, or silicon-germanium.

13. A method comprising:
    obtaining a plurality of data bits corresponding to a program window that is to be written to the memory array;
    dividing the program window into a plurality of sub-windows;
    simultaneously programming half the number of determined bits to memory cells corresponding to one or more of the sub-windows, the programming including floating source lines of memory cells that are not to be programmed based on a pattern of data bits in the sub-window so that a distance between source and drain voltages of different memory cells is increased; and
    programming a plurality of configuration bits that are not related to the programmed bits, where the plurality of configuration bits include a spare bit, an indication bit, and a dynamic reference bit.

14. The method of claim 13, where maximizing the distance between the source and drain voltages reduces leakage current in the memory array.

15. The method of claim 13, where the simultaneously programming further includes:
    floating the source lines by turning off select switches connected to the source lines;
    providing a voltage to drain lines that are connected to memory cells that are to be programmed; and
    grounding source lines that are connected to the memory cells that are to be programmed.

16. The method of claim 13, where the memory cells are each to store two bits of information.

17. The method of claim 13, where the program window includes 256 bits and each of the plurality of the sub-windows includes 64 bits.

18. The method of claim 13, where the number of programmed configuration bits is less than or equal to five.

19. The method of claim 13, where each of the memory cells is formed on a substrate, and the substrate is formed of a semiconducting material.

20. The method of claim 19, where the semiconducting material includes silicon, germanium, or silicon-germanium.

* * * * *